(12) United States Patent
Grodzki

(10) Patent No.: US 12,716,976 B2
(45) Date of Patent: Aug. 25, 2026

(54) OPTIMIZED ACQUISITION OF MEASURED DATA BY MEANS OF MAGNETIC RESONANCE TECHNOLOGY

(71) Applicant: Siemens Healthineers AG, Forchheim (DE)

(72) Inventor: David Grodzki, Erlangen (DE)

(73) Assignee: Siemens Healthineers AG, Forchheim (DE)

( * ) Notice: Subject to any disclaimer, the term of this patent is extended or adjusted under 35 U.S.C. 154(b) by 0 days.

(21) Appl. No.: 19/228,927

(22) Filed: Jun. 5, 2025

(65) Prior Publication Data

US 2025/0377432 A1 Dec. 11, 2025

(30) Foreign Application Priority Data

Jun. 7, 2024 (DE) ..................... 10 2024 205 242.6

(51) Int. Cl.
*G01R 33/565* (2006.01)
*G01R 33/58* (2006.01)

(52) U.S. Cl.
CPC ..... *G01R 33/56572* (2013.01); *G01R 33/586* (2013.01)

(58) Field of Classification Search
CPC ........................ G01R 33/56572; G01R 33/586
See application file for complete search history.

(56) References Cited

U.S. PATENT DOCUMENTS 8,878,533 B2 11/2014 Grodzki et al.
9,664,765 B2 * 5/2017 Hanada ............ G01R 33/56518
10,228,434 B2 * 3/2019 Polimeni ............ G01R 33/5616
10,996,307 B2 * 5/2021 Carinci ................ G01R 33/583
(Continued)

FOREIGN PATENT DOCUMENTS

CN 101981462 A 2/2011
CN 102288929 A 12/2011
(Continued)

OTHER PUBLICATIONS

Weiger Markus et al: "MRI with Zero Echo Time: Hard versus Sweep Pulse Excitation", in: Magnetic Resonance in Medicine, vol. 66, 2011, pp. 379-389, DOI: 10.1002/mrm.22799.
(Continued)

*Primary Examiner* — Gregory H Curran
(74) *Attorney, Agent, or Firm* — Banner & Witcoff, Ltd.

(57) ABSTRACT

Techniques are described for acquiring data of an examination object and imaging parameters for an acquisition of measured data via an acquisition method in which gradients to be switched for position encoding of the measured data have their full strength during an irradiation of the RF excitation pulses, and a desired flip angle are loaded. The feasibility of the correction, the acquisition method is selectively performed with the loaded imaging parameters and the loaded flip angle. If a feasibility check is negative, a pulse duration of the RF excitation pulses to be irradiated in the acquisition method and/or of the desired flip angle are adjusted into an adjusted flip angle and/or at least one of the desired imaging parameters into an adjusted imaging parameter, and the acquisition method is performed with an adjusted pulse duration and/or with an adjusted flip angle and/or with an adjusted imaging parameter.

11 Claims, 3 Drawing Sheets

(56) References Cited

U.S. PATENT DOCUMENTS

| | | | |
|---|---|---|---|
| 2011/0026799 | A1 | 2/2011 | Nehrke et al. |
| 2012/0249139 | A1 | 10/2012 | Kopanoglu et al. |
| 2014/0028313 | A1 | 1/2014 | Paul |
| 2019/0011520 | A1 | 1/2019 | Feiweier et al. |
| 2019/0285711 | A1 | 9/2019 | Keupp et al. |
| 2023/0213602 | A1 | 7/2023 | Grodzki |

FOREIGN PATENT DOCUMENTS

| | | | |
|---|---|---|---|
| CN | 103576114 | A | 2/2014 |
| CN | 110226098 | A | 9/2019 |
| DE | 102021215124 | A1 | 7/2023 |

OTHER PUBLICATIONS

Heid/Deimling: “Rapid Single Point (RASP) Imaging”, SMR, 3rd Annual Meeting, p. 684, 1995.

Herrler J. et al: “Fast Online-Customized (FOCUS) Parallel Transmission Pulses: A Combination Of Universal Pulses And Individual Optimization”, Magnetic Resonance in Medicine ;85:3140-3153, DOI: 10.1002/mrm.28643; 2021.

Wu Yaotang et al: “Density of Organic Matrix of Native Mineralized Bone Measured by Water- and Fat-Suppressed Proton Projection MRI”, Magn. Reson. Med. 50:S. 59-68, 2003.

Grodzki M. et al: “Correcting Slice Selectivity in Hard Pulse Sequences”, Journal of Magnetic Resonance; vol. 214 (2012); pp. 61-67; DOI: 10.1016/j.jmr.2011.10.005; 2012.

Balcom et al: “Single-Point Ramped Imaging with T1 Enhancement (SPRITE)”; Journal of Magnetic Resonance, Series A 123, 131-134 (1996).

Nielles-Vallespin S. et al: “3D Radial Projection Technique with Ultrashort Echo Times for Sodium MRI: Clinical Applications in Human Brain and Skeletal Muscle”, Magn. Res. Med. 2007; 57; S. 74-81.

Jul. 18, 2025 (DE) Decision to Grant—App. 102024205242.6 (w/ English translation).

Mar. 10, 2025 (DE) Office Action—App. 102024205242.6 (w/ English translation).

* cited by examiner 1
3
U
7.1
7.2
5
L
$S_i$
7
9
RF controller
7'
Gradient controller
5'
13
Controller
S
15
Storage
Adapting controller
26
I/O

OPTIMIZED ACQUISITION OF MEASURED DATA BY MEANS OF MAGNETIC RESONANCE TECHNOLOGY

CROSS-REFERENCE TO RELATED APPLICATIONS

The present application claims priority to and the benefit of Germany patent application no. DE 10 2024 205 242.6, filed on Jun. 7, 2024, the contents of which are incorporated herein by reference in their entirety.

TECHNICAL FIELD

The disclosure relates to an improved acquisition of measured data by means of magnetic resonance technology using a radial acquisition method with interscan delay.

BACKGROUND

Magnetic resonance (MR) technology is a known technology with which images of the interior of an object under examination can be generated. Put simply, for this the object under examination is positioned in a magnetic resonance device in a comparatively strong static, homogeneous constant magnetic field, also called a B0 field, with field strengths of 0.2 Tesla to 7 Tesla and more, so that its nuclear spins are oriented along the constant magnetic field. To trigger nuclear spin resonances measurable as signals, radio-frequency excitation pulses (RF pulses) are irradiated into the object under examination, the triggered nuclear spin resonances are measured as so-called k-space data by means of coils designed for receiving, and on the basis thereof MR images are reconstructed or spectroscopy data is determined. The magnetic alternating field generated by the excitation pulses irradiated by means of at least one transmit coil is also referred to as a B1 field. For position encoding of the measured data, rapidly switched magnetic gradient fields, called gradients for short, are superimposed on the constant magnetic field. A schematic diagram used which describes a temporal sequence of RF pulses to be irradiated and gradients to be switched is referred to as a pulse sequence, a pulse sequence schematic diagram, or a sequence for short. The measured data acquired is digitized and stored as complex numerical values in a k-space matrix. An associated MR image can be reconstructed from the k-space matrix populated with values, for example by means of a multidimensional Fourier transform.

SUMMARY

Using conventional sequences, such as for example a (T) SE sequence ("(Turbo) Spin Echo") or a GRE sequence ("Gradient Echo"), it is hence not possible to acquire substances or tissues, such as for example bones, tendons, ligaments, teeth, or even ice, which have T2* times of well below 500 microseconds (μs), since a corresponding signal from these substances or tissues has already decayed at the time of acquisition in the case of (T) SE or GRE sequences.

However, MR methods are already known which permit very short echo times TE (e.g. TE<500 μs), which are in the range of the corresponding decay time. With these, it is possible for example to show bones, teeth, or ice in an MR image, although the T2* time of these objects is in a range of 30-80 μs.

These MR methods for example include the UTE sequence ("Ultrashort Echo Time"), as described inter alia in the article by Sonia Nielles-Vallespin "3D radial projection technique with ultrashort echo times for sodium MRI: Clinical applications in human brain and skeletal muscle", Magn. Res. Med. 2007; 57; p. 74-81. In this sequence type, after a waiting period following a non-selective or layer-selective excitation, the gradients are ramped up and data acquisition is started simultaneously. The k-space trajectory scanned in this way following an excitation runs radially outward from the k-space center. Hence before reconstructing the image data from the raw data acquired in the k-space by means of a Fourier transform, this raw data must first be converted to a Cartesian k-space grid, for example by what is known as "re-gridding."

Further MR methods, which permit especially short echo times, are zTE ("zero echo time") and PETRA ("pointwise encoding time reduction with radial acquisition") or else WASPI ("water- and fat-suppressed proton projection MRI") sequences, and are described for example in the article by Weiger et al., "MRI with Zero Echo Time: Hard versus Sweep Pulse Excitation" Magnetic Resonance in Medicine 66: p. 379-389, 2011, in U.S. Pat. No. 8,878,533B2 (PETRA) and in the article by Wu et al., "Density of Organic Matrix of Native Mineralized Bone Measured by Water- and Fat-Suppressed Proton Projection MRI", Magn. Reson. Med. 50: p. 59-68, 2003. In both methods, measured data is acquired in k-space along radial spokes whose gradients switched for position encoding have already been fully ramped up at the time of excitation of the spins in an object under examination, which saves valuable encoding time. However, this also creates an area in the k-space center which cannot be scanned by these radial spokes. Compared to UTE methods, zTE and PETRA methods are more robust, since eddy currents or undesired small time differences from switched gradients or irradiated RF pulses have no or at most a negligible influence on the measurements.

An example of a part of a pulse sequence for such an acquisition of measured data along radial spokes, as employed in zTE, WASPI and PETRA methods, is shown in FIG. 1. Shown in the top line "Tx/Rx" are the irradiated RF excitation pulses RF and the readout time window ADC, during which the acquisition of the measured data takes place. Shown in the center line "G" are the gradients switched in an encoding direction, which have each reached their strength desired for the following acquisition of measured data at the time of the irradiation of an RF excitation pulse RF1. Shown in the lower line "k-sp" are the associated k-space points scanned along the k-space trajectory specified by the gradient field created for the acquisition of the measured data. Here, measured k-space points are shown as black dots, and k-space points located prior to the start of the readout time window ADC, and hence non-read-out k-space points, are shown as "empty" points. The reason that k-space points are not read out is because, as described, a constant gradient field is already applied before the RF excitation pulse RF is irradiated. As a result, the central k-space point (k=0) would have to be measured simultaneously with the irradiation of the RF excitation pulse RF1, which is technically not possible. Only after a minimum required switching time Ts after the end of an RF excitation pulse RF1, which is dependent on the hardware of the magnetic resonance system used, can the acquisition of the measured data be started in the readout time window ADC, which still results in a (shortest) echo time TE. The first k-space point k* read out in the readout time window ADC has the minimum distance from k-space center k0 among the read-out k-space points. The last k-space point kmax read out in the readout time window ADC has the maximum distance from k-space center k0 among the read-out k-space points. The duration of the readout time window ADC (acquisition duration) is given by the strength of the gradient field G applied and the required resolution or the desired field of view (FOV) or the matrix of the image to be created from the measured data.

An associated scanning schematic diagram of the k-space is shown in FIG. 2, wherein a radial k-space spoke corresponds to a k-space trajectory along which measured data is acquired in a readout time window ADC. Measured data is acquired along radial spokes in different encoding directions, until for example a desired density of the scanning in the k-space is achieved. The radius of the central area B, in which no measured data is acquired along the described radial spokes, depends on the k-space torque accumulated after the excitation until the acquisition of the measured data, and thus on the echo time TE in which the gradient is switched with a constant strength, and on the strength of the switched gradient field G. The longer this echo time TE and the stronger the strength of the gradient, and thus the higher the readout bandwidth, the more k-space points are not measured on the radial k-space trajectories. zTE, WASPI and PETRA methods are thus characterized by the fact that they acquire echo signals and capture them along radial k-space trajectories as measured data, which however has an interscan delay dependent on the smallest echo time used, which can correspond to the described non-radially scanned area B, since no measured data for k-space points $k<k^*$ is acquired. When mention is made below generally of radial acquisition methods with interscan delay, acquisition methods such as for example zTE, WASPI or PETRA methods are therefore meant, in which gradients for the encoding of measured data have reached their desired strength right at the start of an excitation by an RF excitation pulse, said strength also being kept constant during a following readout time window ADC.

MR data from this area B, which is not scanned radially, can be reconstructed algebraically from the measured data of the radial spokes in zTE methods. In WASPI methods, a small number of further measurements are carried out along second radial k-space trajectories, wherein the strength of the gradients is reduced, to be able to acquire measured data closer to the k-space center.

In PETRA methods, measured data can be acquired from the area B not scanned radially using an MR single-point acquisition method, for example RASP ("rapid single point") as described for example in the article by Heid et al., "Rapid Single Point (RASP) imaging", Proc. Intl. Soc. Mag. Reson. Med., p. 684, 1995, or a "single-point SPRITE" method as described for example in the article by Balcom et al., "Single-Point Ramped Imaging with T1 Enhancement (SPRITE)", J. Magn. Reson. A 123 (1): p. 131-134, 1996, e.g. on a Cartesian grid.

However, the fact that the gradients are already switched on during the excitation also hides certain disadvantages of the zTE, WASPI and PETRA sequences compared for example to UTE sequences, since the possibilities of the types of excitation are thereby restricted. Whereas in UTE sequences it is also possible to employ spatially restricted RF excitation pulses, for example for a two-dimensional (2D) or three-dimensional (3D) spatially selective excitation, the respective excitation must take place in zTE, PETRA, or WASPI sequences with a square pulse (also called a "hard pulse"), which is as spatially non-selective as possible. As described in the article by Grodzki et al., "Correcting slice selectivity in hard pulse sequences", Proc. Intl. Soc. Mag. Reson. Med. 20, p. 2479, 2012, despite the use of such spatially non-selective hard pulses as RF excitation pulses, an undesired slice selectivity can occur precisely because of the gradients already switched during the irradiation of the RF excitation pulses, and this can only be corrected within certain limits. A correction is possible if at least one first zero point of a spectral pulse profile of an RF excitation pulse used, which in a square RF excitation pulse corresponds to a sinc, is outside the field of view. If account is taken of the fact that the excitation bandwidth of an RF pulse, which indicates the spectral width of the possible excitation, is given by the inverse of the duration of the RF pulse, it proves to be advantageous to use an RF excitation pulse which is as short as possible. A high excitation bandwidth, and thus a high half-value width of a pulse profile of an RF excitation pulse used, thus facilitates the correction based on a matrix inversion described in the above-mentioned article by Grodzki et al. However, the achievable flip angle decreases the shorter the RF excitation pulse used.

Examples of further correlations here between common imaging parameters and RF excitation pulses used are:

The strength of the gradient switched during the irradiation of the RF excitation pulses is proportional to the selected readout bandwidth and to the selected resolution, which in turn is the quotient of the desired field of view with the desired matrix size of the k-space matrix to be populated with measured data [FOV/matrix size=resolution].

The selected flip angle of RF excitation pulses used is (with the same B1 amplitude) proportional to the pulse duration of the RF excitation pulses.

In hitherto known radial acquisition methods with interscan delay, use is always made, in particular for zTE, WASPI, and PETRA methods, in general independently of desired imaging parameters, such as for example a selected readout bandwidth, a desired resolution or also a required flip angle, of the same hard-coded hard pulse as an RF excitation pulse with fixed pulse parameters, e.g. with a fixed pulse duration, which also establishes a maximum flip angle together with a maximum pulse amplitude. For most users of such radial acquisition methods with interscan delay, the correlations outlined above are too complex to independently carry out an optimization of imaging parameters and pulse parameters used, especially if a correction of described disturbances caused by undesired slice selectivity is also desired. However, until now it has been up to a user not to select too high a readout bandwidth or resolution (and thus at the same time the strength of the gradient switched during the irradiation of the RF excitation pulses) for the selected field of view, and to thereby prevent artifacts. This is often not successful. In addition, due to the previously fixed pulse duration of the RF excitation pulses used, an achievable flip angle is always the same, although depending on the application, larger or significantly lower flip angles than the maximum possible flip angle would in fact be desired.

The object of the disclosure is to enable a determination of optimized parameters, e.g. of optimized pulse parameters, such as for example pulse durations, for RF excitation pulses and/or of imaging parameters for radial acquisition methods with interscan delay, such that a possible correction of disturbances caused by undesired slice selectivity is also facilitated or enabled, wherein for instance imaging parameters matched to desired imaging protocols and individual applications can be taken into account.

The object is achieved by the various embodiments described herein, which includes methods, a magnetic resonance system, a computer program, and an electronically readable data carrier as described herein, including the claims, for an improved acquisition of measured data from an object under examination located in a measured volume of a magnetic resonance installation.

A method for the improved acquisition of measured data from an object under examination located in a measured volume of a magnetic resonance installation comprises the steps:

- loading desired imaging parameters for an acquisition of echo signals generated after RF excitation pulses as measured data by means of an acquisition method, in which gradients to be switched for position encoding of the measured data have their full strength during an irradiation of the RF excitation pulses, wherein the desired imaging parameters comprise a desired field of view and at least one imaging parameter from the group including a desired readout bandwidth, a desired resolution, and a desired matrix size of the matrix in which the measured data is to be stored,
- loading a desired flip angle for irradiated RF excitation pulses,
- determining a quantification value of an expected disturbance for the acquisition method on the basis of the desired imaging parameters,
- performing a check on the feasibility of a correction of the disturbance on the basis of the quantification value,
- performing the acquisition method with the loaded imaging parameters and the loaded flip angle, if the check confirms the feasibility of the correction, and, if the check on the feasibility is negative, adjusting, on the basis of the quantification value, a pulse duration of the RF excitation pulses to be irradiated in the context of the acquisition method and/or adjusting the desired flip angle into an adjusted flip angle and/or adjusting at least one of the desired imaging parameters into an adjusted imaging parameter, and performing the acquisition method with an adjusted pulse duration and/or with an adjusted flip angle and/or with an adjusted imaging parameter,
- storing and/or further processing the measured data acquired with the acquisition method performed.

A check on the feasibility of a correction of an expected disturbance for the acquisition method and where appropriate a subsequent, e.g. automatic, adjustment of parameters relevant to the acquisition method, such that the feasibility of the correction is achieved. Thus an optimized acquisition of measured data is enabled, taking into account imaging parameters desired by a user (for example for determined imaging protocols or individual applications), the results of which are free of artifacts resulting from the aforementioned disturbance without correction.

Especially when using radial acquisition methods with interscan delay, e.g. when using zTE, WASPI, and PETRA methods, for the acquisition of measured data, this can result in a disturbance due to an undesired slice selectivity, as described above. The present method ensures that boundary conditions resulting from the complex correlations between RF excitation pulses used and further imaging parameters, and the facilitation (or also enabling) of a correction of this disturbance, are automatically adhered to, without a user having to be able to understand these correlations. Rather, the method can automatically define pulse parameters of RF excitation pulses to be used from desired pulse parameters that can be set by a user, such as a readout bandwidth, a field of view (FOV) and a matrix size (which together specify the strength of the gradient switched during the excitation), or from a flip angle, whereby limitations in a hardware-related achievable amplitude of the RF excitation pulse (B1m) can be taken into account, and can delimit a parameter space that can be selected by a user, e.g. the imaging parameters such as the readout bandwidth, the resolution or the possible flip angle.

A magnetic resonance installation comprises a magnet unit, a gradient unit, a radio-frequency unit, and a control facility designed for the performance of a method with an optimization unit.

A computer program may implement a method on a control facility if it is executed on the control facility. For example, the computer program comprises commands which when the program is executed by a control facility, for example a control facility of a magnetic resonance installation, cause said control facility to execute any of the methods as discussed herein. The control facility may be configured in the form of a computer.

The computer program may also be present in the form of a computer program product, which can be loaded directly into a memory of a control facility, with program code means to execute any of the methods as discussed herein if the computer program product is executed in a computing unit of the computing system.

A computer-readable storage medium comprises commands, which when executed by a control facility, for example a control facility of a magnetic resonance installation, cause said control facility to execute any of the methods as discussed herein.

The computer-readable storage medium may be designed as an electronically readable data storage medium, which contains electronically readable control information stored thereon, which comprises at least one computer program and is designed such that it performs an any of the methods as discussed herein when the data storage medium is used in a control facility of a magnetic resonance installation.

The advantages and embodiments specified in respect of any of the methods as discussed herein also apply analogously for the magnetic resonance installation, the computer program product, and the electronically readable data storage medium.

BRIEF DESCRIPTION OF THE DRAWINGS

Further advantages and details of the present disclosure emerge from the exemplary embodiments described below and on the basis of the drawings. The examples listed do not represent any restriction of the disclosure. In the drawings.

DETAILED DESCRIPTION OF THE DISCLOSURE

Figure 1:
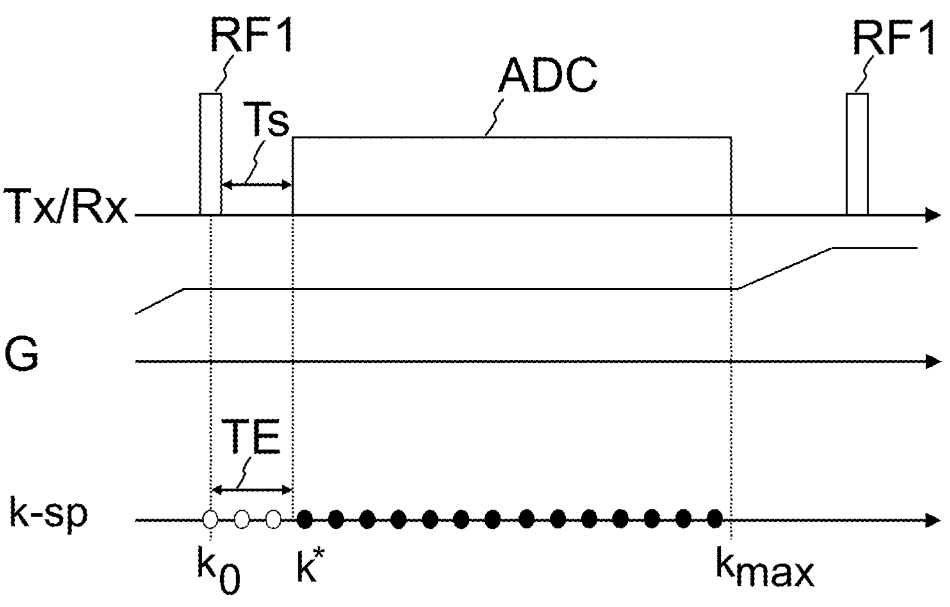
FIG. 1 illustrates a schematically represented part of an example pulse sequence schematic diagram for capturing measured data, in accordance with one or more embodiments of the present disclosure.
Figure 2:
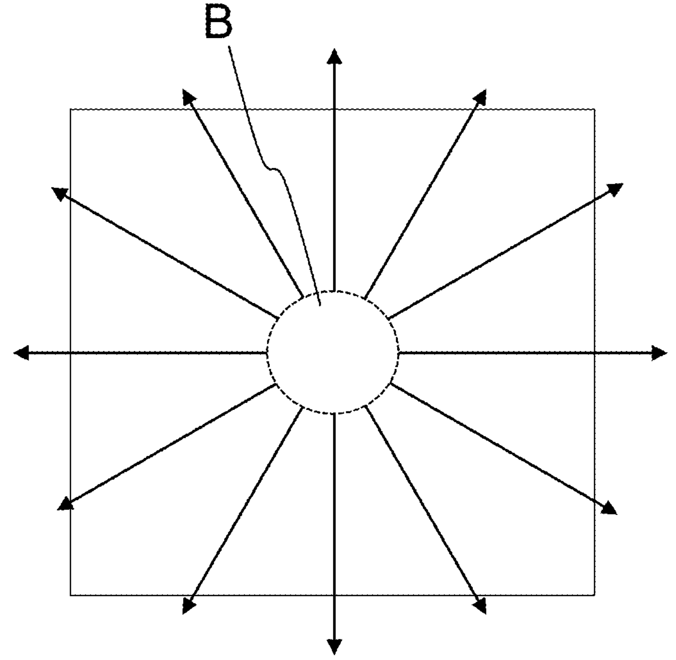
FIG. 2 illustrates a schematically represented exemplary k-space scanning schematic diagram, in accordance with one or more embodiments of the present disclosure.
Figure 3:
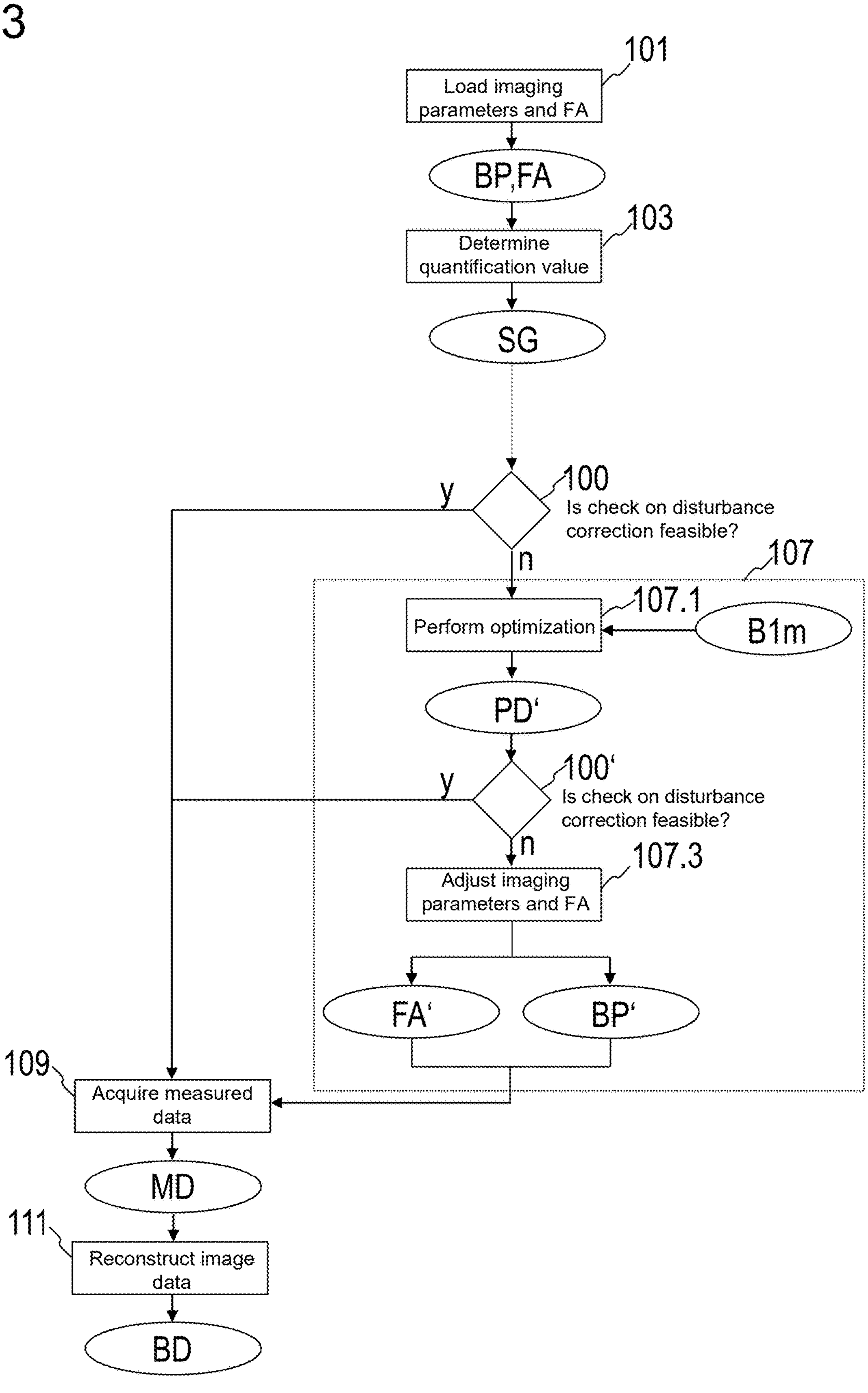
FIG. 3 illustrates a schematic flow diagram of an example method, in accordance with one or more embodiments of the present disclosure.

FIG. 3 is a schematic flow diagram of an example method for the improved acquisition of measured data (MDS) from an object under examination located in a measured volume of a magnetic resonance installation.

For an acquisition of echo signals generated after RF excitation pulses as measured data by means of an acquisition method, in which gradients G to be switched for position encoding of the measured data have their full strength during an irradiation of the RF excitation pulses, desired imaging parameters BP and a desired flip angle FA are loaded (Block 101), wherein the desired imaging parameters comprise a desired field of view and at least one imaging parameter from the group including a desired readout bandwidth, a desired resolution, and a desired matrix size of the matrix in which the measured data is to be stored. Such an acquisition can for example take place by means of a radial acquisition method with interscan delay, e.g. with a zTE, a WASPI or a PETRA method.

On the basis of the desired imaging parameters BP, a quantification value SG of an expected disturbance is determined for the acquisition method (Block 103). The quantification value SG is here selected so that it is characteristic of the expected disturbance.

Values which characterize a shape of a pulse profile of RF excitation pulses used are for example suitable as a quantification value SG for radial acquisition methods with interscan delay, since the expected disturbance can be described as an aliasing of a pulse profile into a magnetization distribution acquired as echo signals. For instance, a value correlating with an excitation bandwidth and/or half-value width of a pulse profile of irradiated RF excitation pulses can be used as a quantification value SG, since—as described above in respect of the article by Grodzki et al.—the feasibility of a correction of disturbances by the proposed matrix inversion depends on the pulse profile, e.g. on first zero points of the pulse profiles.

The quantification value SG may for example correspond to the strength of the gradients G switched during the irradiation of RF excitation pulses, which in each case is proportional to the readout bandwidth and field of view imaging parameters (and thus also proportional to the resolution imaging parameter and inversely proportional to the matrix size imaging parameter).

On the basis of the determined quantification value SG, a check 100 on the feasibility of a correction of the disturbance is performed. For example, the check on the feasibility of a correction of the disturbance can include a comparison of a position, determined on the basis of the quantification value SG, of a first zero point of a pulse profile of irradiated RF excitation pulses, with a desired field of view, wherein the feasibility is for example confirmed if the first zero point is outside the field of view.

If the check 100 confirms the feasibility of the correction (100, "y"), the acquisition method is performed with the loaded imaging parameters BP and the loaded flip angle FA, so that measured data MD is acquired (Block 109), which can be stored and/or further processed.

If the check 100 on the feasibility is negative (100, "n"), an optimization is performed (block 107.1), which on the basis of the quantification value SG a) adjusts a pulse duration of the RF excitation pulses to be irradiated in the context of the acquisition method into an adjusted pulse duration PD' and/or b) adjusts the desired flip angle into an adjusted flip angle FA' and/or c) adjusts at least one of the desired imaging parameters into an adjusted imaging parameter BP' (Block 107). The acquisition method is then performed with at least one adjusted parameter from the group including an adjusted pulse duration PD', an adjusted flip angle FA' and/or at least one adjusted imaging parameter BP', so that measured data MD is acquired (Block 109).

An adjustment of a pulse duration of the RF excitation pulses to be irradiated in the context of the acquisition method into an adjusted pulse duration PD' (block 107.2) can take place, such that due to the adjusted pulse duration PD' a first zero point of a pulse profile of irradiated RF excitation pulses is outside a desired field of view. Here, the adjusted pulse duration PD' can for instance be smaller than a previously given, non-adjusted pulse duration. As already mentioned above, an adjustment of a pulse duration in the form of a reduction in pulse duration shifts a position of a first zero point outward.

An adjustment of a pulse duration of the RF excitation pulses to be irradiated in the context of the acquisition method into an adjusted pulse duration PD' can take place taking into account a maximum amplitude B1m of RF excitation pulses to be irradiated that is inherent to a magnetic resonance installation used. For instance, for smaller desired flip angles, which do not make full use of the maximum amplitude B1m of RF excitation pulses to be irradiated at a preset pulse duration, the adjusted pulse duration can be reduced compared to the preset pulse duration and the amplitude of RF excitation pulses to be irradiated can be increased at the same time to obtain the desired flip angle. In this case for example the amplitude can be increased to the maximum amplitude B1m of RF excitation pulses to be irradiated, to determine a minimum adjusted pulse duration PD'.

On the basis of the determined quantification value SG and the adjusted pulse duration PD', a further check (block 100') on the feasibility of a correction of the disturbance can be performed. For example, the further check 100' on the feasibility of a correction of the disturbance can include a comparison of a position, determined on the basis of the quantification value SG, of a first zero point of a pulse profile of irradiated RF excitation pulses modified in accordance with the adjusted pulse duration with a desired field of view, wherein the feasibility is for example confirmed if the first zero point is outside the field of view.

If the further check 100' confirms the feasibility of the correction (100', "y"), it was possible to determine a suitable adjusted pulse duration and the acquisition method can be performed with the loaded imaging parameters BP and the loaded flip angle FA and with the adjusted pulse duration PD', so that measured data MD is acquired (Block 109), which can be stored and/or further processed.

When adjusting the desired flip angle FA into an adjusted flip angle FA', an adjusted flip angle FA' can be smaller than the (originally) desired flip angle FA. For smaller flip angles FA' there is greater flexibility for an adjustment of the pulse duration and it is more likely that the feasibility of a correction of the disturbance is possible.

An adjustment of the desired flip angle FA into an adjusted flip angle FA' can for instance occur if an adjustment of a pulse duration of the RF excitation pulses to be irradiated in the context of the acquisition method, such that due to the adjusted pulse duration PD' a first zero point of a pulse profile of irradiated RF excitation pulses is outside a desired field of view, is not possible for the loaded, desired flip angle FA. The flip angle FA (and additionally the pulse duration) can here be adjusted such that a first zero point of a pulse profile of irradiated RF excitation pulses is outside a desired field of view. For this purpose, a largest possible adjusted flip angle FA' can be determined, for example on the basis of the maximum amplitude B1m, and, by determining, on the basis of this longest possible modified pulse duration, a longest possible modified pulse duration with which a position of first zero points of a pulse profile of irradiated RF excitation pulses is just outside a desired field of view, wherein the largest possible flip angle can be determined as proportional to a product of the maximum amplitude B1m with the longest possible pulse duration.

Additionally or alternatively to an adjustment of the flip angle FA into an adjusted flip angle FA', an adjustment of at least one of the desired imaging parameters BP into an adjusted imaging parameter BP' can occur if an adjustment of a pulse duration of the RF excitation pulses to be irradiated in the context of the acquisition method, such that due to the adjusted pulse duration a first zero point of a pulse profile of irradiated RF excitation pulses is outside a desired field of view, may not be possible despite an adjusted flip angle FA'. Since the loaded desired imaging parameters BP are desired by a user, they should only be adjusted if otherwise, i.e. despite an already adjusted flip angle FA' and an adjusted pulse duration PD', the feasibility of the correction of the disturbance cannot be confirmed.

Such an adjustment of the at least one imaging parameter BP can occur such that a check for feasibility of the correction performed on the basis of a quantification value SG determined on the basis of adjusted imaging parameters BP' confirms the feasibility. In other words, e.g. those imaging parameters on the basis of which the quantification value SG is determined are adjusted such that an adjusted quantification value is obtained, which enables the feasibility of the correction of the disturbance. Using the example of a strength of a gradient G switched during the excitation by irradiation of RF excitation pulses as a quantification value SG, a decrease in the strength of the gradient G leads to a broadening of the pulse profile of the RF excitation pulse and thus to a shift outward of a position of a first zero point of the pulse profile. Here, a maximum reduced strength of the gradient G can be determined. In order to achieve such a maximum reduced strength of the gradient G, a desired resolution can for example be reduced as a desired imaging parameter BP into an adjusted resolution, and/or a desired readout bandwidth can be lowered as a desired imaging parameter BP to an adjusted readout bandwidth in order to reduce the strength of the gradient G.

It is hereby possible to propose to the user either a reduction in a desired resolution into an adjusted resolution and/or a lowering of a desired readout bandwidth to an adjusted readout bandwidth, or a combination of both the measures, so that the user can choose the adaptation of imaging parameters, which can for example be best reconciled with the desired imaging protocol or with the desired application, for example for a determined imaging area, and is thus perceived as the smallest limitation.

Thus, an adjustment of at least one of the desired imaging parameters BP into an adjusted imaging parameter BP' may comprise a reduction in a desired resolution to an adjusted resolution and/or a lowering of a desired readout bandwidth to an adjusted readout bandwidth.

Since the adjusted imaging parameters BP' are determined such that they permit the feasibility of the correction of the disturbance, the acquisition method can be performed with the adjusted imaging parameters BP', so that measured data MD is acquired (Block 109).

Measured data MD acquired with the acquisition method can be stored and further processed, for example reconstructed into image data BD (Block 111).

Figure 4:
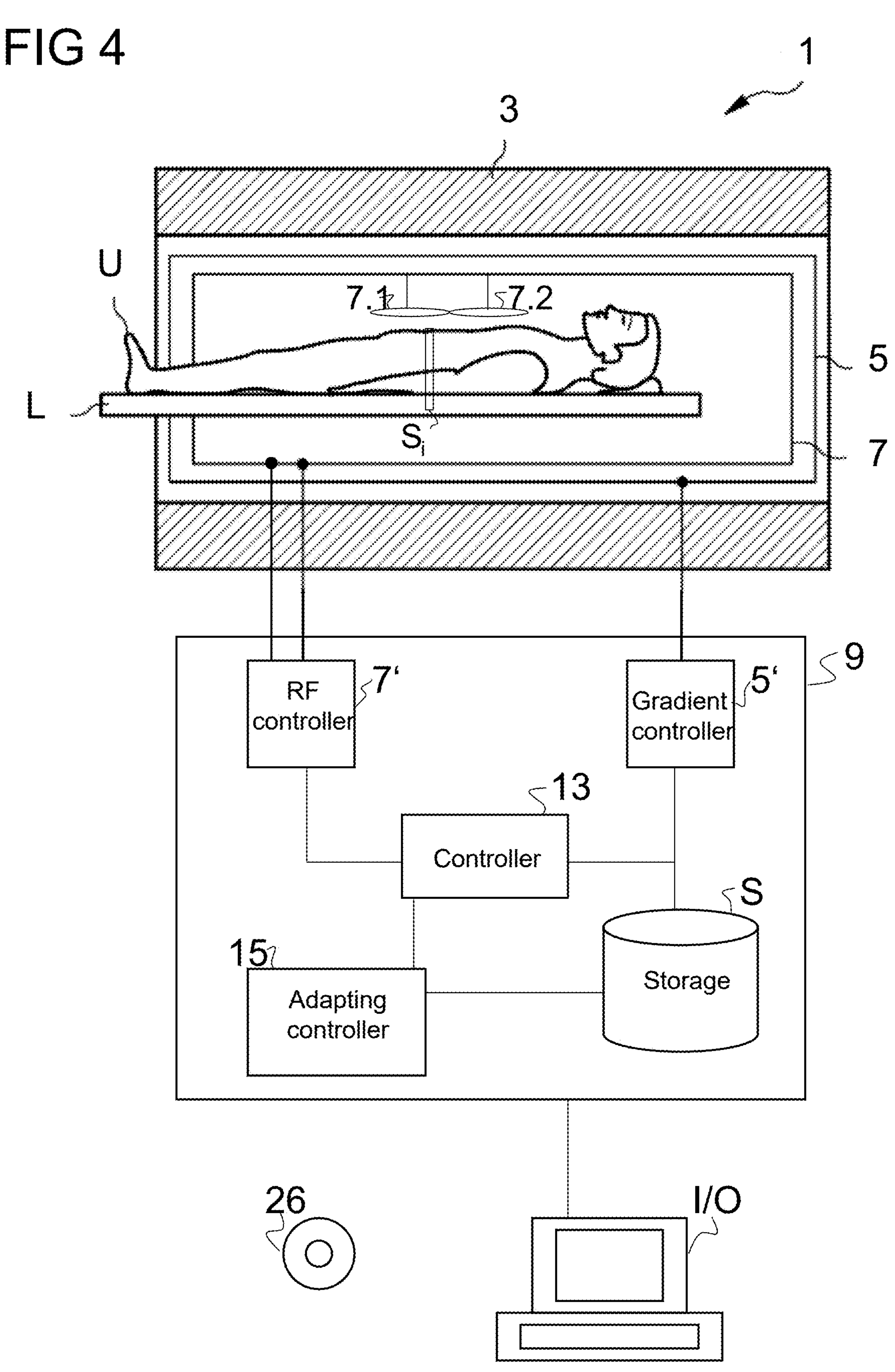
FIG. 4 illustrates a schematically represented exemplary magnetic resonance installation, in accordance with one or more embodiments of the present disclosure.

FIG. 4 schematically represents a magnetic resonance installation 1 (also referred to herein as a magnetic resonance imager). This comprises a magnet unit 3 (also referred to herein as a main magnet) for generating the constant magnetic field, a gradient unit 5 (also referred to herein as a gradient field generator) for generating the gradient fields, a radio-frequency unit 7 (also referred to herein as an RF transceiver) for irradiation and for receiving radio-frequency signals, and a control facility 9 (also referred to herein as a controller) designed to perform any of the methods as discussed herein.

In FIG. 4, these subunits of the magnetic resonance installation 1 are represented roughly schematically. The radio-frequency unit 7 can include multiple subunits and can for example comprise multiple coils. In an embodiment, the radio-frequency unit 7 can comprise a body coil, which is permanently integrated into the magnetic resonance installation 1, and in turn for example can comprise two antenna elements 7.1 and 7.2. Furthermore, the radio-frequency unit 7 can comprise one or more different local coils, which either can be configured only for transmitting radio-frequency signals or only for receiving the triggered radio-frequency signals or for both, and can in turn comprise multiple antenna elements and associated coil channels.

To examine an object under examination U, for example a patient or also a phantom, the latter can be introduced into the measured volume (also referred to herein as a patient receiving area or region) of the magnetic resonance installation 1 on a couch L. The slices S1 or S2 represent exemplary target volumes of the object under examination, from which echo signals can be acquired and captured as measured data.

The control facility 9 serves to control the magnetic resonance installation 1 and may e.g. control the gradient unit 5 by means of a gradient controller 5' (also referred to herein as a gradient controller), and the radio-frequency unit 7 by means of a radio-frequency transmit/receive controller 7' (also referred to herein as a radiofrequency (RF) controller). The radio-frequency unit 7 can here comprise multiple channels, on which signals can be transmitted or received.

The radio-frequency unit 7 is, together with its radio-frequency transmit/receive controller 7', responsible for the generation and irradiation (transmission) of a radio-frequency alternating field for manipulation of the spins in an area to be manipulated (for example in slices S to be measured) of the object under examination U. In this case, the center frequency of the radio-frequency alternating field, also known as the B1 field, is generally speaking ideally set so that it is close to the resonance frequency of the spins to be manipulated. Deviations of the center frequency from the resonance frequency are referred to as off-resonance. To generate the B1 field, currents controlled in the radio-frequency unit 7 by means of the radio-frequency transmit/receive controller 7' are applied to the RF coils.

The control facility 9 further comprises an optimization unit 15 (also referred to herein as an optimizing controller or optimizing circuitry) for an adjustment of a pulse duration of the RF excitation pulses to be irradiated in the context of the acquisition method and/or an adjustment of a desired flip angle into an adjusted flip angle and/or an adjustment of at least one desired imaging parameter into an adjusted imaging parameter. The control facility 9 is overall designed to perform any of the methods as described herein.

A computing unit 13 (also referred to herein as a computing system, computer, or controller) comprised by the control facility 9 is designed to perform all the computing operations required for the necessary measurements and determinations. Intermediate results required or determined for this purpose, and results, can be stored in a storage unit S of the control facility 9. The units shown are not necessarily to be understood as physically separate units, but merely represent a subdivision into meaningful units, which however can also be implemented in fewer or even in only one single physical unit.

Control commands can be routed to the magnetic resonance installation via an input/output facility I/O (also referred to herein as a user interface) of the magnetic resonance installation 1, for example by a user, and/or results of the control facility 9 such as for example image data can be displayed.

A method described herein can also be present in the form of a computer program, which comprises commands which may execute any of the methods as described herein on a control facility 9. Likewise, a computer-readable storage medium can be present, which comprises commands which, when executed by a control facility 9 of a magnetic resonance installation 1, cause the latter to execute any of the methods as described herein.

The various components described herein may be referred to as "units." Such components may be implemented via any suitable combination of hardware and/or software components as applicable and/or known to achieve their intended respective functionality. This may include mechanical and/or electrical components, processors, processing circuitry, or other suitable hardware components, in addition to or instead of those discussed herein. Such components may be configured to operate independently, or configured to execute instructions or computer programs that are stored on a suitable computer-readable medium. Regardless of the particular implementation, such units, as applicable and relevant, may alternatively be referred to herein as "circuitry," "controllers," "processors," or "processing circuitry," or alternatively as noted herein.

What is claimed is:

1. A method for acquiring measured data from an object under examination located in a measured volume of a magnetic resonance imager, comprising:

loading desired imaging parameters for an acquisition of echo signals generated after radio frequency (RF) excitation pulses as measured data via an acquisition method, wherein gradients to be switched for position encoding of the measured data along radial spokes in k-space have a full strength during an irradiation of the RF excitation pulses, wherein the desired imaging parameters comprise a desired field of view and one or more of a desired readout bandwidth, a desired resolution, and a desired matrix size of a matrix in which the measured data is to be stored, loading a desired flip angle for the irradiation of the RF excitation pulses;

determining a quantification value of an expected disturbance for the acquisition method based upon the desired imaging parameters, performing a check on a feasibility of a correction of the expected disturbance based upon the quantification value;

when the check confirms the feasibility of the correction, performing the acquisition method with the loaded imaging parameters and the loaded flip angle;

when the check on the feasibility of the correction is negative:

adjusting, based upon the quantification value, one or more of (i) a pulse duration of the RF excitation pulses to be irradiated in the context of the acquisition method to an adjusted pulse duration, (ii) the desired flip angle to an adjusted flip angle, and (iii) at least one of the desired imaging parameters to an at least one adjusted imaging parameter; and performing the acquisition method with one or more of (i) the adjusted pulse duration, (ii) the adjusted flip angle, and (iii) the at least one adjusted imaging parameter; and storing and/or further processing the measured data acquired with the respective acquisition method that is performed.

2. The method of claim 1, wherein the quantification value correlates with a half-value width of a pulse profile of the irradiated RF excitation pulses, and corresponds to the strength of the gradients switched during the irradiation of the RF excitation pulses.

3. The method of claim 1, wherein the check on the feasibility of the correction of the disturbance comprises a comparison of a position of a first zero point of a pulse profile of the irradiated RF excitation pulses with the desired field of view, and wherein the feasibility is confirmed when the first zero point is outside the desired field of view.

4. The method of claim 1, further comprising:

wherein an adjustment of a pulse duration of the RF excitation pulses to be irradiated in the context of the acquisition method to an adjusted pulse duration takes place such that, due to the adjusted pulse duration, a first zero point of a pulse profile of the irradiated RF excitation pulses is outside the desired field of view.

5. The method of claim 1, further comprising:

wherein an adjustment of a pulse duration of the RF excitation pulses to be irradiated in the context of the acquisition method to an adjusted pulse duration takes into account a maximum amplitude of the RF excitation pulses to be irradiated.

6. The method of claim 1, wherein when the desired flip angle is adjusted, the adjusted flip angle is smaller than the desired flip angle.

7. The method of claim 1, wherein the desired flip angle is adjusted to the adjusted flip angle when an adjustment of a pulse duration of the RF excitation pulses to be irradiated in the context of the acquisition method to the adjusted pulse duration is not possible for the loaded desired flip angle such that, due to the adjusted pulse duration, a first zero point of a pulse profile of the irradiated RF excitation pulses is outside the desired field of view, and the desired flip angle and the pulse duration are adjusted such that the first zero point of the pulse profile of the irradiated RF excitation pulses is outside the desired field of view.

8. The method of claim 1, wherein an adjustment of at least one of the desired imaging parameters to an adjusted imaging parameter takes place when an adjustment of a pulse duration of the RF excitation pulses to be irradiated in the context of the acquisition method into an adjusted pulse duration is not possible such that, due to the adjusted pulse duration, a first zero point of a pulse profile of the irradiated RF excitation pulses is outside a desired field of view, and the adjustment of the at least one of the desired imaging parameters take place such that a check for feasibility of the correction is performed based on a quantification value determined based on the at least one adjusted imaging parameter that confirms the feasibility.

9. The method of claim 1, wherein an adjustment of at least one of the imaging parameters to an adjusted imaging parameter comprises a reduction to a reduced resolution and/or a reduction to a reduced readout bandwidth.

10. A magnetic resonance imager, comprising:

a magnet unit;

a gradient unit;

a radio-frequency unit; and a controller having an optimization unit, the controller being configured to cause the magnetic resonance imaging system to:

load desired imaging parameters for an acquisition of echo signals generated after radio frequency (RF) excitation pulses as measured data via an acquisition method, wherein gradients to be switched for position encoding of the measured data along radial spokes in k-space have a full strength during an irradiation of the RF excitation pulses, wherein the desired imaging parameters comprise a desired field of view and one or more of a desired readout bandwidth, a desired resolution, and a desired matrix size of a matrix in which the measured data is to be stored, load a desired flip angle for the irradiation of the RF excitation pulses;

determine a quantification value of an expected disturbance for the acquisition method based upon the desired imaging parameters, perform a check on a feasibility of a correction of the expected disturbance based upon the quantification value;

when the check confirms the feasibility of the correction-is-verified, perform the acquisition method with the loaded imaging parameters and the loaded flip angle;

when the check on the feasibility of the correction is negative:

adjust, based upon the quantification value, one or more of (i) a pulse duration of the RF excitation pulses to be irradiated in the context of the acquisition method to an adjusted pulse duration, (ii) the desired flip angle to an adjusted flip angle, and (iii) at least one of the desired imaging parameters to an at least one adjusted imaging parameter; and perform the acquisition method with one or more of (i) the adjusted pulse duration, (ii) the adjusted flip angle, and (iii) the at least one adjusted imaging parameter; and store and/or further process the measured data acquired with the respective acquisition method that is performed.

11. A non-transitory computer-readable storage medium, comprising instructions that, when executed by a controller of a magnetic resonance imager, cause the magnetic resonance imager to:

load desired imaging parameters for an acquisition of echo signals generated after radio frequency (RF) excitation pulses as measured data via an acquisition method, wherein gradients to be switched for position encoding of the measured data along radial spokes in k-space have a desired strength during an irradiation of the RF excitation pulses, wherein the desired imaging parameters comprise a desired field of view and one or more of a desired-readout bandwidth, a desired resolution, and a desired matrix size of a matrix in which the measured data is to be stored, loading a desired flip angle for the irradiation of the RF excitation pulses;

determining a quantification value of an expected disturbance for the acquisition method based upon the desired imaging parameters, performing a check on a feasibility of a correction of the expected disturbance based upon the quantification value;

when the check confirms the feasibility of the correction, performing the acquisition method with the loaded imaging parameters and the loaded flip angle;

when the check on the feasibility of the correction is negative:

adjusting, based upon the quantification value, one or more of (i) a pulse duration of the RF excitation pulses to be irradiated in the context of the acquisition method to an adjusted pulse duration, (ii) the desired flip angle to an adjusted flip angle, and (iii) at least one of the desired imaging parameters to an at least one adjusted imaging parameter; and performing the acquisition method with one or more of (i) the adjusted pulse duration, (ii) the adjusted flip angle, and (iii) the at least one adjusted imaging parameter; and storing and/or further processing the measured data acquired with the respective acquisition method that is performed.

* * * * *